United States Patent [19]
Tashiro et al.

[11] Patent Number: 5,059,788
[45] Date of Patent: Oct. 22, 1991

[54] OPTICAL LOGIC DEVICE WITH PNPN DETECTION AND LASER DIODE OUTPUT

[75] Inventors: Yoshiharu Tashiro; Kenichi Kasahara, both of Tokyo, Japan

[73] Assignee: NEC Corporation, Tokyo, Japan

[21] Appl. No.: 489,990

[22] Filed: Mar. 7, 1990

[30] Foreign Application Priority Data

Mar. 7, 1989 [JP] Japan ................................. 1-55343

[51] Int. Cl.$^5$ ............................................. H01J 31/50
[52] U.S. Cl. ................................. 250/213 A; 250/551; 377/102
[58] Field of Search ............................ 250/213 A, 551; 377/102

[56] References Cited

U.S. PATENT DOCUMENTS 3,708,672 1/1973 Marinkovic ......................... 250/551
4,475,046 10/1984 Nishida et al. ...................... 250/551

FOREIGN PATENT DOCUMENTS 54-37461 3/1979 Japan ............................. 250/213 A

OTHER PUBLICATIONS

IBM Technical Disclosure Bulletin, vol. 4, No. 1, Jun. 1961.
IBM Technical Disclosure Bulletin, vol. 12, No. 10, Mar. 1970.

Primary Examiner—David C. Nelms
Assistant Examiner—Que T. Le
Attorney, Agent, or Firm—Sughrue, Mion, Zinn, Macpeak & Seas

[57] ABSTRACT

A laser diode and an optical switching device are connected in parallel relative to a power supply. The optical switching device is turned on by receiving an input light, and stores the ON state, so that the laser device is turned off. As a result, an electric power consumption is decreased, the structure is simplified, and the adjustment becomes easy.

4 Claims, 4 Drawing Sheets

OPTICAL LOGIC DEVICE WITH PNPN DETECTION AND LASER DIODE OUTPUT

FIELD OF THE INVENTION

This invention relates to an optical logic device, and more particularly to, an optical logic device which is optically turned on and off.

BACKGROUND OF THE INVENTION

In these days, research and development of optical functional devices have been intensively carried out to process a large amount of information in a high speed. Among the optical functional devices, much attention has been paid to an optical bistable device to be utilized as a key element in an optical information processing system. For this purpose, various kinds of optical devices have been proposed. In principle, all kinds of optical input and output logic devices can be provided by combining an inverter and an AND circuit. In this point, less number of proposals have been made on an inverter for inverting an input light, from which an output light is not emitted when an input light is supplied thereto, and an output light is emitted when no input light is supplied thereto, although various types of AND circuits have been proposed. One of such inverters is described on pages 393 to 400 of "the report No. J-66(5), 1983, in the Institute of Electronics Informations and Communications Engineers". The inverter comprises a photodiode for receiving an input light, a first light emitting diode connected in series to the photodiode to provide the photodiode with a positive feedback light, a second light emitting diode for emitting an inverted output light, a first resistance connected between a power supply and the second light emitting diode to provide a predetermined saturation characteristic for the output light, a second resistance connected between the photodiode and the ground for setting a threshold value between the two stable states, and a diode connected in series to the second light emitting diode to minimize a light output in the OFF state. The structure of this inverter will be explained in more detail later.

In operation, where no input light is supplied to the photodiode, a reverse bias voltage is applied to the photodiode, so that almost all of a power supply voltage is applied to the photodiode. As a result, no feedback light is supplied from the first light emitting diode to the photodiode, because no current flows substantially through the first light emitting diode. On the other hand, a forward bias voltage is applied across the second light emitting diode and the diode in series connected, so that a current flows through the second light emitting diode, from which an inverted light output is thereby emitted.

On the contrary, where an input light is supplied to the photodiode, a current flows through the photodiode, so that a feedback light is supplied from the first light emitting diode to the photodiode by a portion of the current flowing through the photodiode. Thus, the current is increased to provide an increased voltage drop across the first resistance so that a voltage is decreased to be applied across the second light emitting diode and the diode in series connected. As a result, an output light which is emitted from the second light emitting diode is decreased. In this state, it is possible that no output light is emitted from the second light emitting diode by setting a built-in voltage of the diode, a voltage of the power supply, and a value of the first resistance to be appropriate levels. Consequently, an optical inverter is realized to provide the two stable states.

However, the above described optical inverter has disadvantages in that the adjustment of a functioning point, etc. is complicated because the element number and kinds such as the photodiode, the light emitting diodes, the diode, and the resistance, etc. are difficult to be decreased, and the isolation of light is absolutely necessary to be carried out, because the feedback of light is utilized to provide an optical bistable device. A further disadvantage is observed in that a light input is necessary to be supplied to the photodiode in providing a light output from the inverter, because the light output is turned off, where the light input is turned off. As a result, an electric power consumption becomes large for a light source, where inverters are arranged in a matrix pattern on a plane of an integrated device.

SUMMARY OF THE INVENTION

Accordingly, it is an object of this invention is to provide an optical logic device, in which the number of elements is decreased in the integration thereof.

It is a further object of this invention to provide an optical logic device, in which the isolation of light is relieved.

It is a still further object of this invention to provide an optical logic device, in which an electric power consumption is decreased.

According to this invention, an optical logic device, comprises:
- an optical switching device which is turned on and off dependent on the presence of an input light; and
- a laser diode for emitting an output light in accordance with the turning on and off of the optical switching device.

BRIEF DESCRIPTION OF THE DRAWINGS

This invention will be explained in more detail in conjunction with appended drawings, wherein.

DESCRIPTION OF THE PREFERRED EMBODIMENT

Before explaining an optical logic device in the preferred embodiment according to the invention, the aforementioned conventional inverter will be explained.

Figure 1:
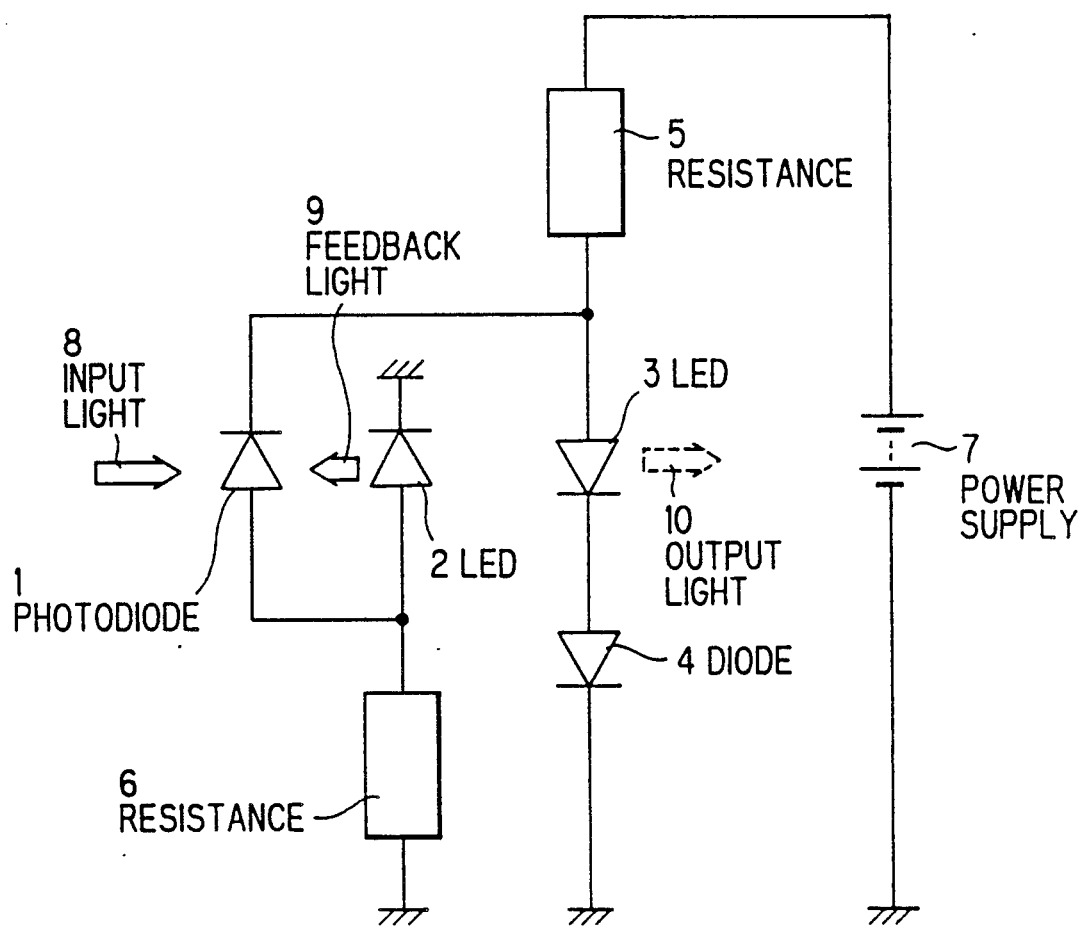
FIG. 1 is a flock diagram showing a conventional optical inverter.

FIG. 1 shows the conventional inverter which comprises a photodiode 1 for receiving an input light 8, a first light emitting diode 2 for providing the photodiode 1 with a feedback light 9, a second light emitting diode 3 for emitting an output light 10 which is inverted relative to the input light 8, a diode 4 for suppressing an output light of the second light emitting diode 3 in the OFF state of the output light 10, a first resistance 5 for providing a saturating characteristic on the output light 10, a second resistance 6 for setting a threshold value of a shift between the ON and OFF states, and a power supply 7 for applying a reverse voltage through the first resistance 5 to the photodiode 1 and a forward voltage through the first resistance 5 to a serial connection of the second light emitting diode 3 and the diode 4.

Operation of the conventional optical inverter was explained before. Therefore, it is not described here.

Next, an optical logic device in the preferred embodiment according to the invention will be explained in FIG. 2. The optical logic device comprises a parallel connection of a pnpn device 11 and a laser diode 12, a resistance 15 having a resistance value of $R_L$, for instance 50Ω, and a power supply 16 for applying a predetermined voltage to the parallel connection, wherein an anode 24 of the pnpn device 11 is connected to a p-electrode 32 of the laser diode 12, and a cathode of the pnpn device 11 is connected to an n-electrode 33 of the laser diode 12. In this preferred embodiment, the pnpn device 11 is of a AlGaAs/GaAs system, and the laser diode 12 is one having an oscillation wavelength of 0.78 μm, although no limitation is not added thereto. The pnpn device 11 has a property, in which a switching voltage Vs is 5 V, a holding voltage Vh is 1.5 V, and a differential resistance is 5Ω at a voltage of more than the holding voltage in the ON state, while the laser diode 12 has a property, in which a built-in voltage Vb is 1.5 V, an oscillation threshold current Ith is 20 mA, and a differential resistance is 3Ω at a voltage of more than the built-in voltage Vb.

In operation, an electric pulse having an applied voltage of 3V is applied to the parallel connection of the pnpn device 11 and the laser diode 12 by the power source 16. Th pnpn device 11 remains turned off in accordance with the applied voltage which is less than the switching voltage of 5V, while the laser diode is turned on with an oscillation current of approximately 28 mA to emit an output light 10.

In this circumstance, an input light 8 having a light amount of 2 pJ (0.2 mW×10nS) which is sufficiently larger than a switching light amount of 1 pJ for the pnpn device 11 is supplied to the pnpn device 11, so that the pnpn device 11 is turned on. Thus, a current flows through the pnpn device 11, so that a current flowing through the laser diode 12 is decreased to be approximately 17 mA which is less than the oscillation threshold current of 20 mA. This results in the cease of the oscillation in the laser diode 12. Therefore, the optical logic device is summarized to have a function of an inverter in that, where there is no input light 8, the output light 10 is emitted, while, where there is the input light 8, no output light 10 is emitted. Furthermore, information of the input light 8 is held in the pnpn device 11 for a desired time duration, unless a resetting voltage, of lower than a holding voltage, is applied to the pnpn device 11 by the power supply 16. This means that the input light 8 may be appropriate to be supplied to the pnpn device 11 which is thereby turned on for a prescribed short time period. As a result, an electric power consumption is decreased for a light source.

Figure 2:
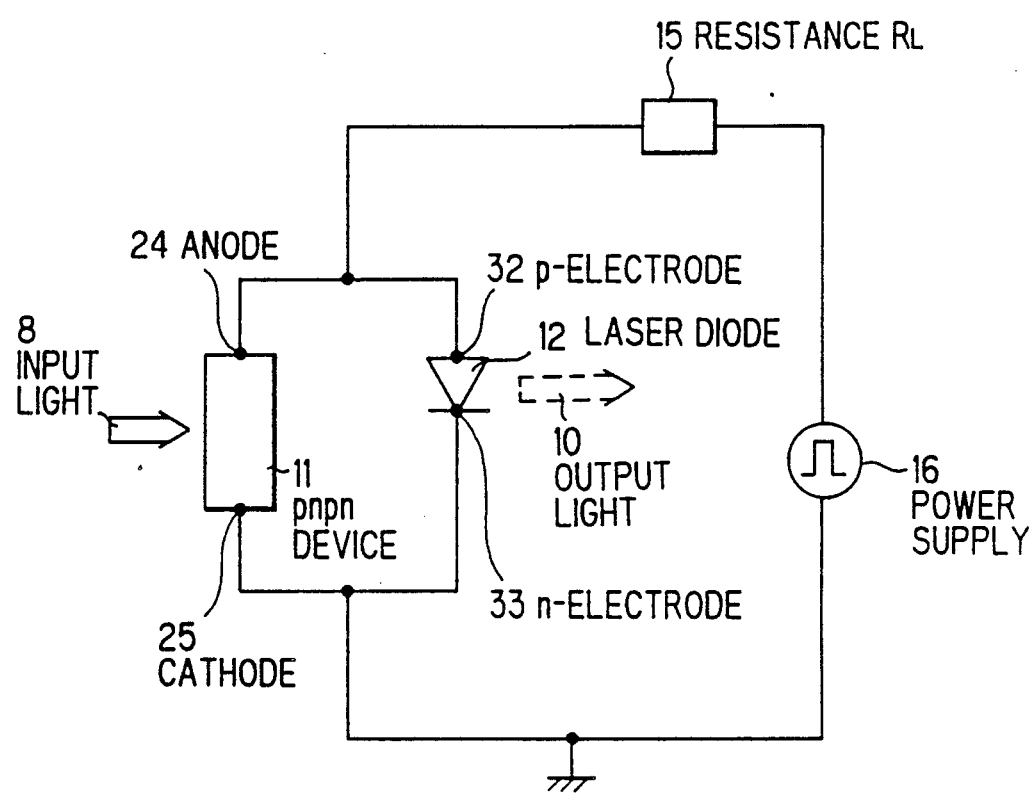
FIG. 2 is a block diagram showing an optical logic device in a preferred embodiment according to the invention.
Figure 3:
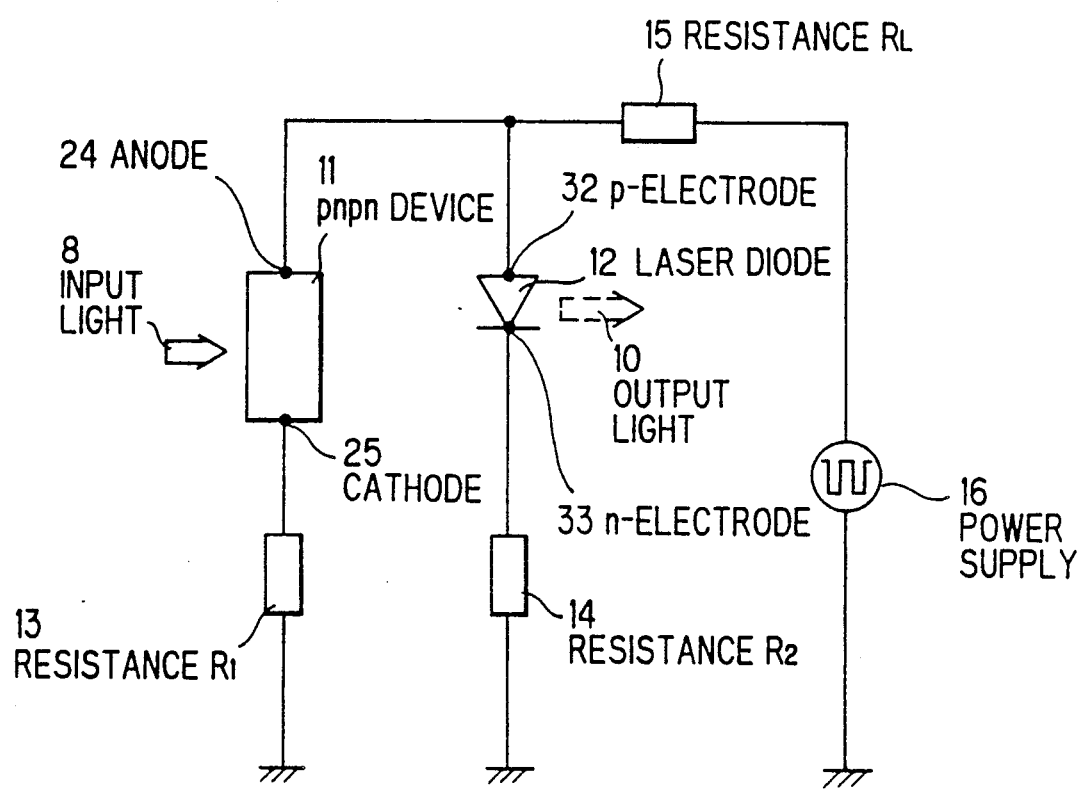
FIG. 3 is a block diagram showing an optical logic device in another preferred embodiment.

FIG. 3 shows an optical logic device in the other preferred embodiment according to the invention, wherein like parts are indicated by like reference numerals as used in FIG. 2, except that a first resistance 13 having a resistance value of $R_1$ is inserted between the cathode 25 of the pnpn device 11 and the ground, and a second resistance 14 having a resistance value of $R_2$ is inserted between the n-electrode 33 and the ground.

In general, the equations (1) to (4) must be met in the optical logic device as shown in FIGS. 2 and 3.

$$\frac{V - Vb}{R_L + R_2 + R_{FL}} > Ith \quad (1)$$

$$Vh < V - \frac{R_L(V - Vb)}{R_L + R_2 + R_{FL}} < Vs \quad (2)$$

$$Vh < \frac{(R_2 + R_{FL})(R_1 + Rv)V + (R_1 + Rv)R_L Vb}{(R_2 + R_{FL})(R_1 + Rv) + (R_1 + Rv)R_L} \quad (3)$$

$$\frac{(R_2 + R_{FL})(R_1 + Rv)(V - Vb) + (R_2 + R_{FL})R_L(Vh - Vb)}{(R_2 + R_{FL})(R_1 + Rv) + (R_1 + Rv)R_L + (R_2 + R_{FL})R_L} < Ith(R_2 + R_{FL}) \quad (4)$$

In the equation (1) to (4), V is a voltage of the power supply 16, Vb is a built-in voltage of the laser diode 12, $R_L$ is a resistance value of the load resistance 15, $R_1$ is a resistance value of the resistance 13 connected in series to the pnpn device 11, $R_2$ is a resistance value of the resistance 14 connected in series to the laser diode 12, $R_{FL}$ is a differential resistance at a voltage of more than the built-in voltage in the laser diode 12, Vh is a holding voltage of the pnpn device 11, Vs is a switching voltage of the pnpn device 11, Rv is a differential resistance at a voltage of more than the holding voltage in the ON state of the pnpn device 11.

In the preferred embodiment in FIG. 2,
V=3V
Vb=Vh=1.5V
$R_L$=50Ω
$R_{FL}$=3Ω
Rv=5Ω
Vs=5V
Ith=20 mA
$R_1$=$R_2$=0Ω

These values are substituted in the equations (1) to (4), and the below results are obtained.

0.028>0.02    (1)

1.5<1.58<5    (2)

1.5<1.58    (3)

0.054<0.06    (4)

Thus, it is verified that all the equations (1) to (4) are met in the preferred embodiment in FIG. 2. In other words, as long as a pnpn device, a laser diode, and a load resistance which meet the equations (1) to (4) are adopted, advantages of this invention are obtained.

Figure 4:
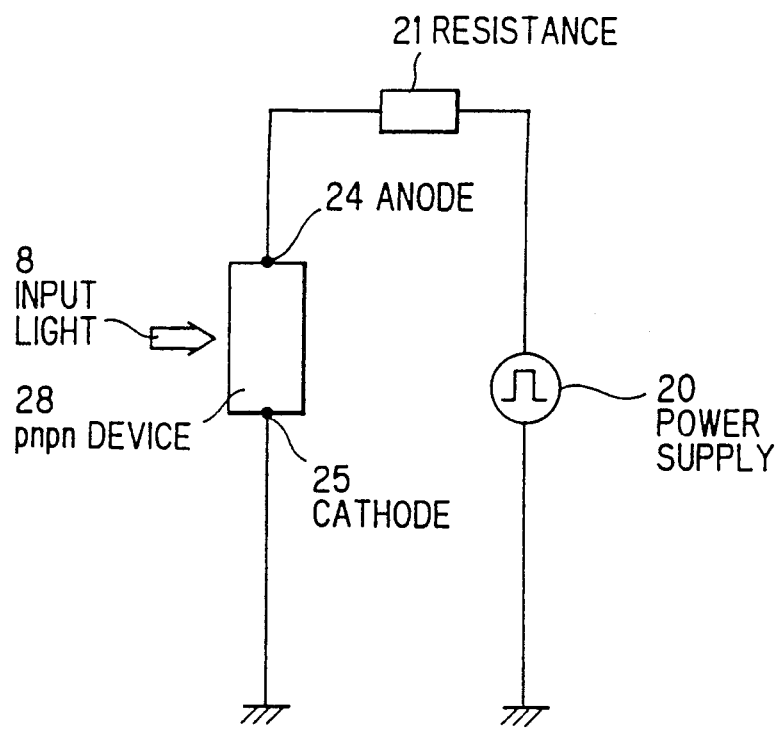
FIG. 4 is a block diagram explaining an optical switching device in the optical logic device in the preferred embodiments.
Figure 5:
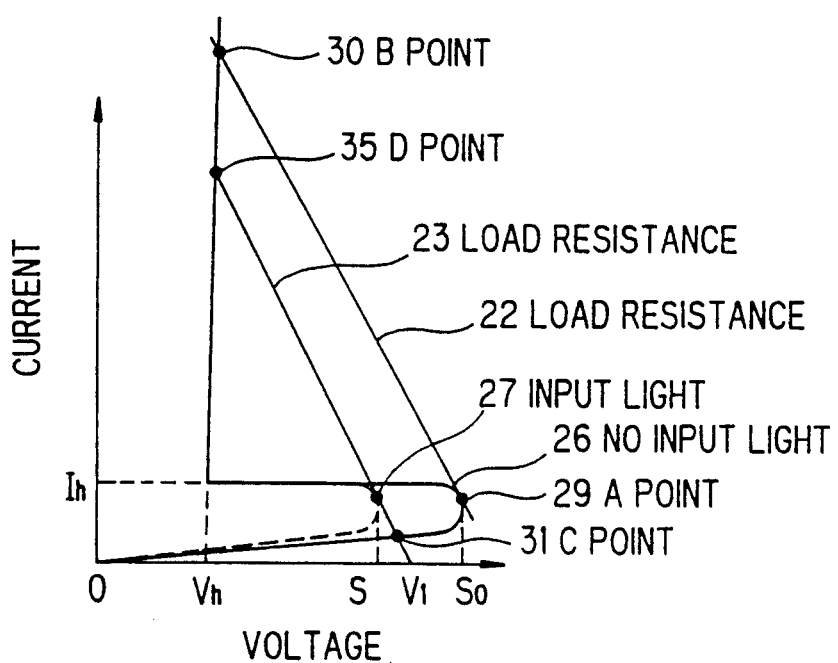
FIG. 5 is a current to voltage characteristic of the optical switching device in FIG. 4.

Then, a bistable property will be explained in utilizing an optical thyristor having a pnpn structure as an optical switching device (defined "a pnpn device" hereinbefore and hereinafter) in FIGS. 4 and 5, wherein FIG. 4 shows a circuitry structure, and FIG. 5 shows a current to voltage characteristic. In FIG. 4, a pnpn device 28 is connected in series at its anode 24 to a resistance 21 which is connected in series to a power supply 20, and at its cathode to the ground.

In operation, a voltage of the power supply 20 is applied to be increased across the pnpn device 28 in the state of no input light supplied thereto, so that a current to voltage line 26 labeled by "NO INPUT LIGHT" as shown in FIG. 5 is obtained. In FIG. 5, when the voltage is increased to a voltage So, the pnpn device 28 is turned on, a switching point A of which is determined by a crossing point between a load resistance line 22 and the current to voltage line 26. Where the voltage is more increased, the point A is shifted to a point B. On the other hand, where an input light 8 is supplied to the pnpn device 28, the pnpn device is turned on along a current to voltage line 2 labeled by "INPUT LIGHT". In this circumstance, a switching voltage is S in the pnpn device 28. Thus, where a voltage of the power supply 20 is set to be a voltage $V_1$ between the voltages So and S, and the input light 8 is supplied to the pnpn device 28, an operation point C indicated by a reference numeral 31 is shifted to a point D indicated by a reference number 35, so that a current corresponding to the point D flows through the pnpn device 28. In this state, the pnpn device 28 remains turned on, unless the voltage is decreased to be lower than a holding voltage Vh. As understood from the above, such a pnpn device is controlled to be turned on under a predetermined voltage by an input light, and the turned-on state is held without the input light by a voltage which is more than the holding voltage Vh.

In the preferred embodiments described before, although the optical logic device is used for an inverter, it may be applied to a NAND circuit, a NOR circuit, etc. in the use of a threshold characteristic of the pnpn device by supplying a plurality of input lights thereto. For instance, the NAND circuit is realized in such an arrangement that a plurality of input lights having a total light intensity which is more than a threshold voltage of the pnpn device and each having a light intensity which is less than the threshold voltage are supplied to the pnpn device. Furthermore, where a light receiving region of the pnpn device and a wavelength of light emitted from a laser diode are changed, an optical calculation, an optical information memory etc. are realized at an arbitrary wavelength.

The pnpn device and the laser diode which are used in the preferred embodiments are of ordinary devices which are available in the market, so that a detail of the structures is not explained here.

As understood from the above explanations, the isolation of light is not strict as compared to a conventional structure, because the feedback of light is not utilized, and the number of parts is decreased to decrease the number of steps for adjustment of the optical logic device, because the design of an operating point is performed in consideration of a power supply voltage and resistances. Furthermore, an electric power consumption is decreased for a light source, because a pnpn device which stores information of an input light is utilized, and an integration of parts is easy to be realized, because the number and kind of the parts is less than that in the conventional one.

Although the invention has been described with respect to specific embodiment for complete and clear disclosure, the appended claims are not to be thus limited but are to be construed as embodying all modification and alternative constructions that may occur to one skilled in the art which fairly fall within the basic teaching herein set forth.

What is claimed is:

1. An optical logic device, comprising:
   a pnpn device which is turned on under a predetermined voltage by receiving an input light, said pnpn device having a switching voltage;
   a semiconductor laser diode for emitting an output light under said predetermined voltage, said switching voltage being greater than a turn-on voltage of said semiconductor laser diode; and
   a power supply for applying said predetermined voltage to said pnpn device and said semiconductor laser diode, said predetermined voltage being initially set to a value between said switching voltage and said turn-on voltage causing a current to flow through said semiconductor laser diode which is greater than a threshold current, said current decreasing to be less than said threshold current at an input light stage;
   wherein said predetermined voltage is applied to said semiconductor laser diode to emit said output light, when said pnpn device is turned off; and
   no voltage is applied to said semiconductor laser diode to not emit said output light, when said pnpn device is turned on.

2. An optical logic device, according to claim 1, wherein:
   said pnpn device and said semiconductor laser diode are connected in parallel relative to said power source.

3. An optical logic device, according to claim 1, wherein:
   said pnpn device is an optical thyristor of a pnpn structure.

4. An optical logic device, according to claim 1, wherein:
   said pnpn device and said semiconductor laser diode provide a circuit selected from an inverter, NAND, and NOR.

* * * * *